US010861967B2

United States Patent
Do

(10) Patent No.: US 10,861,967 B2
(45) Date of Patent: Dec. 8, 2020

(54) CELL ARCHITECTURE BASED ON MULTI-GATE VERTICAL FIELD EFFECT TRANSISTOR

(71) Applicant: Samsung Electronics Co., Ltd., Suwon-si (KR)

(72) Inventor: Jungho Do, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/819,823

(22) Filed: Mar. 16, 2020

(65) Prior Publication Data

US 2020/0219974 A1     Jul. 9, 2020

Related U.S. Application Data

(63) Continuation of application No. 16/257,890, filed on Jan. 25, 2019, now Pat. No. 10,629,682.

(60) Provisional application No. 62/685,340, filed on Jun. 15, 2018.

(51) Int. Cl.
| | | |
|---|---|---|
| *H01L 29/78* | (2006.01) | |
| *H01L 27/092* | (2006.01) | |
| *H01L 29/66* | (2006.01) | |
| *H01L 27/24* | (2006.01) | |

(52) U.S. Cl.
CPC ........ *H01L 29/7827* (2013.01); *H01L 27/092* (2013.01); *H01L 27/2454* (2013.01); *H01L 29/66666* (2013.01)

(58) Field of Classification Search
CPC .................. H01L 21/8232; H01L 29/1025
See application file for complete search history.

(56) References Cited

U.S. PATENT DOCUMENTS

| | | |
|---|---|---|
| 9,893,207 B1 | 2/2018 | Balakrishnan et al. |
| 9,935,106 B2 | 4/2018 | Nowak et al. |
| 9,953,973 B1 | 4/2018 | Balakrishnan et al. |
| 9,954,529 B2 | 4/2018 | Anderson et al. |
| 2016/0336324 A1 | 11/2016 | Li et al. |
| 2018/0097107 A1 | 4/2018 | Anderson et al. |

OTHER PUBLICATIONS

Yongchan Ban, et al. "Improving Performance, Power, and Area by Optimizing Gear Ratio of Gate-Metal Pitches in Sub-10nm Node CMOS Designs," Symposium on VLSI Technology Digest of Technical Papers, pp. 137-138 (2018).

*Primary Examiner* — Cheung Lee
(74) *Attorney, Agent, or Firm* — Harness, Dickey & Pierce, P.L.C.

(57) ABSTRACT

A cell architecture is provided. A cell architecture including a vertical field effect transistor (VFET) having at least two fins serving as a vertical channel, a gate including a first gate portion surrounding the first fin, a second gate portion surrounding the second fin, and a third gate portion providing connection therebetween, and a top source/drain (S/D) including a first top S/D portion on the first fin and a second top S/D portion on the second fin, a gate contact structure connected to the third gate portion, a top S/D contact structure connected to one of the first top S/D portion or the second top S/D portion and serving as a horizontal conductive routing layer; and metal patterns on the gate contact structure and the top S/D contact structure and connected thereto through vias, and serving as a vertical conductive routing layer may be provided.

19 Claims, 20 Drawing Sheets

US 10,861,967 B2

CELL ARCHITECTURE BASED ON MULTI-GATE VERTICAL FIELD EFFECT TRANSISTOR

CROSS-REFERENCE TO RELATED APPLICATION

This non-provisional application is a continuation of U.S. application Ser. No. 16/257,890, filed on Jan. 25, 2019, which claims priority under 35 U.S.C. § 119 to U.S. Provisional Patent Application No. 62/685,340 filed on Jun. 15, 2018 in the U.S. Patent and Trademark Office, the contents of each of which are incorporated herein by reference in their entirety.

BACKGROUND

1. Field

Some example embodiments of the inventive concepts disclosed herein relate to cell architectures based on vertical field effect transistors (VFETs) including two or more fins, and/or manufacturing methods thereof.

2. Description of the Related Art

In the semiconductor industry, the term "gear ratio" (GR) refers to the ratio between gate and vertical metal layer pitches. GR affects pin accessibility, routability, and/or cell density characteristics.

Conventional planar or horizontal field effect transistors (e.g., a planar field effect transistor, a horizontal fin field effect transistor (horizontal FinFET), or a horizontal nanosheet field effect transistor (HNS FET)) generally provide a gear ratio of 1:1. To improve GR, a standard cell architecture based on such planar or horizontal field effect transistors use a vertical metal routing layer in addition to a horizontal metal routing layer. Thus, manufacturing complexity and production cost for the standard cell architecture increases.

A cell architecture that has an improved GR (meaning a GR of m:n, where m and n are natural numbers and n is greater than m) and can be implemented without using an additional metal routing layer is highly desired.

SUMMARY

Some example embodiments of the inventive concepts disclosed herein relate to a standard cell implanted based on one or more multi-gate vertical field effect transistors (VFETs).

Some example embodiments of the inventive concepts disclosed herein relate to a cell architecture based on multi-gate vertical field effect transistors (VFETs) including two or more fins.

Some example embodiments of the inventive concepts disclosed herein relate to a standard cell having a gear ratio of m:n, where m and n are natural numbers and n is greater than m.

According to an example embodiment of the inventive concepts, a cell architecture includes a VFET including a first fin and a second fin protruding from a substrate, the first fin and the second fin spaced apart from each other in a first direction and elongated in a second direction crossing the first direction, a gate including a first gate portion on a sidewall of the first fin, a second gate portion on a sidewall of the second fin, and a third gate portion connecting the first gate portion with the second gate portion, and a top S/D including a first top S/D portion at a top of the first fin and a second top S/D portion at a top of the second fin, a gate contact structure spaced apart from the first fin and the second fin in the second direction when viewed in a plan view and connected to the third gate portion, a top S/D contact structure connected to one of the first top S/D portion or the second top S/D portion, at least one of the top S/D contact structure or the gate contact structure serving as a first conductive routing layer in the first direction, and metal patterns on the gate contact structure and the top S/D contact structure, the metal patterns configured to be connected to at least one of the gate contact structure or the top S/D contact structure through vias, respectively, the metal patterns serving as a second conductive routing layer in the second direction According to an example embodiment of the inventive concepts, a cell architecture includes a multi-gate vertical field effect transistor including a first fin and a second fin protruding from a substrate, the first fin and the second fin spaced apart from each other in a first direction and elongated in a second direction crossing the first direction, a bottom S/D on the substrate, the bottom S/D surrounding the first fin and the second fin, a gate including a first gate portion on a sidewall of the first fin, a second gate portion on a sidewall of the second fin, and a third gate portion connecting the first gate portion with the second gate portion, the third gate portion overlapping an end region of the bottom S/D and including an extension area extending away from the first and second fins in the second direction when viewed in a plan view, a top S/D including a first top S/D portion at a top of the first fin and a second top S/D portion at a top of the second fin, the bottom S/D in the substrate, a gate contact structure connected to the third gate portion at the extension area of the third gate portion, a top S/D contact structure connected to one of the first top S/D portion or the second top S/D portion, at least one of the gate contact structure or the top S/D contact structure serving as a first conductive routing layer in the first direction, and metal patterns on the gate contact structure and the top S/D contact structure, the metal patterns configured to be connected to at least one of the gate contact structure or the top S/D contact structure through vias, the metal patterns serving as a second conductive routing layer, in the second direction.

According to an example embodiment of the inventive concepts, a standard inverter cell architecture includes a PMOS vertical field effect transistor (PMOS FET) including a first fin and a second fin protruding from a substrate, the first fin and the second fin spaced apart from each other in a first direction and elongated in a second direction crossing the first direction, a first gate including a first gate portion on a sidewall of the first fin and a second gate portion on a sidewall of the second fin, a first top S/D including a first top S/D portion at a top of the first fin and a second top S/D portion at a top of the second fin, an NMOS vertical field effect transistor (NMOS VFET) including a third fin and a fourth fin protruding from the substrate, the third fin and the fourth fin spaced apart from each other in the first direction and elongated in the second direction in the second direction, a second gate including a third gate portion on a sidewall of the third fin and a fourth gate portion on a sidewall of the fourth fin, and a second top S/D including a third top S/D portion at a top of the third fin and a fourth top S/D portion at a top of the fourth fin, a gate connecting structure at an area between the PMOS VFET and the NMOS VFET and connecting the first, second, third, and fourth gate portions to each other, the gate connecting structure having a shape enclosing four ends of the first, second, third, and fourth fins, which face each other in at least one of the first direction, the second direction, or a third direction diagonal with respect to the first direction and the second direction, top S/D contact structures connected to the second top S/D contact portion and the fourth top S/D contact portion, respectively, a gate contact structure connected to the gate connecting structure and laterally away from the top S/D contact structures in the first direction, at least one of the top S/D contact structures or the gate contact structure serving as a first conductive routing layer in the first direction, and metal patterns configured to be connected to at least one of the gate contact structure, the second top S/D portion, or the fourth top S/D portion through vias, the metal patterns serving as a second conductive routing layer in the second direction.

BRIEF DESCRIPTION OF THE DRAWINGS

The above and other objects, features and effects of inventive concepts will become more apparent to those of ordinary skill in the art by describing in detail example embodiments thereof with reference to the accompanying drawings, in which.

DETAILED DESCRIPTION

Figure 1A:
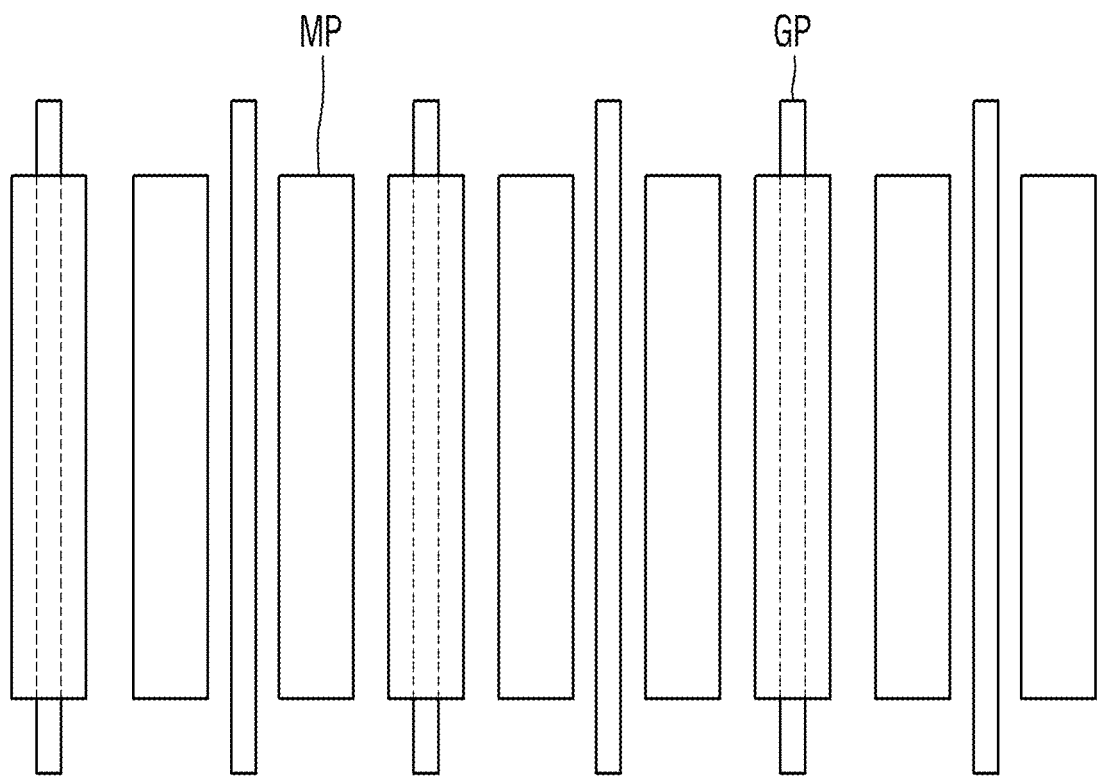
FIGS. 1A and 1B shows gate-metal layouts of standard cell architectures having gear ratios of 2:3 and 3:4, respectively, according to some example embodiments of the present inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are merely provided so that this disclosure will be thorough and complete, and will fully convey the scope of example embodiments to those skilled in the art. In the drawings, the sizes and relative sizes of the various layers and regions may have been exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. (Expressions such as "at least one of," when preceding a list of elements, modify the entire list of elements and do not modify the individual elements of the list.)

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, some example embodiments of the present inventive concepts will be explained with reference to the accompanying drawings.

Figure 1B:
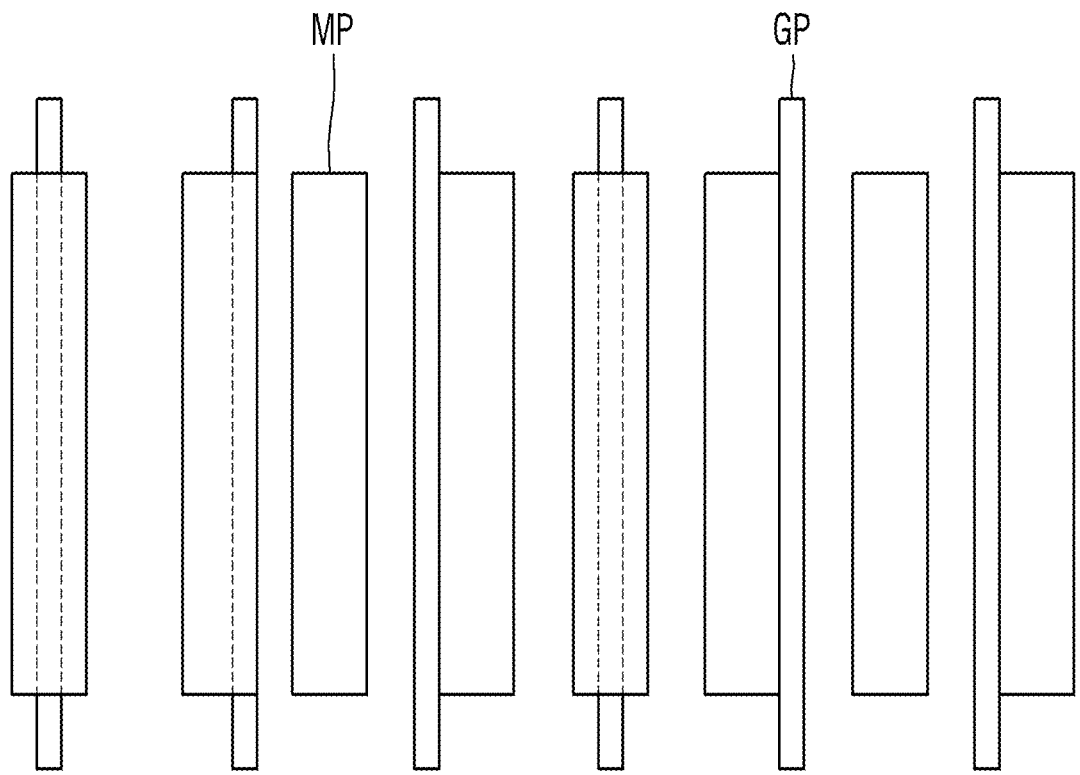

FIGS. 1A and 1B shows gate-metal layouts of standard cell architectures having gear ratios of 2:3 and 3:4, respectively, according to some example embodiments of the present inventive concepts.

Figure 3:
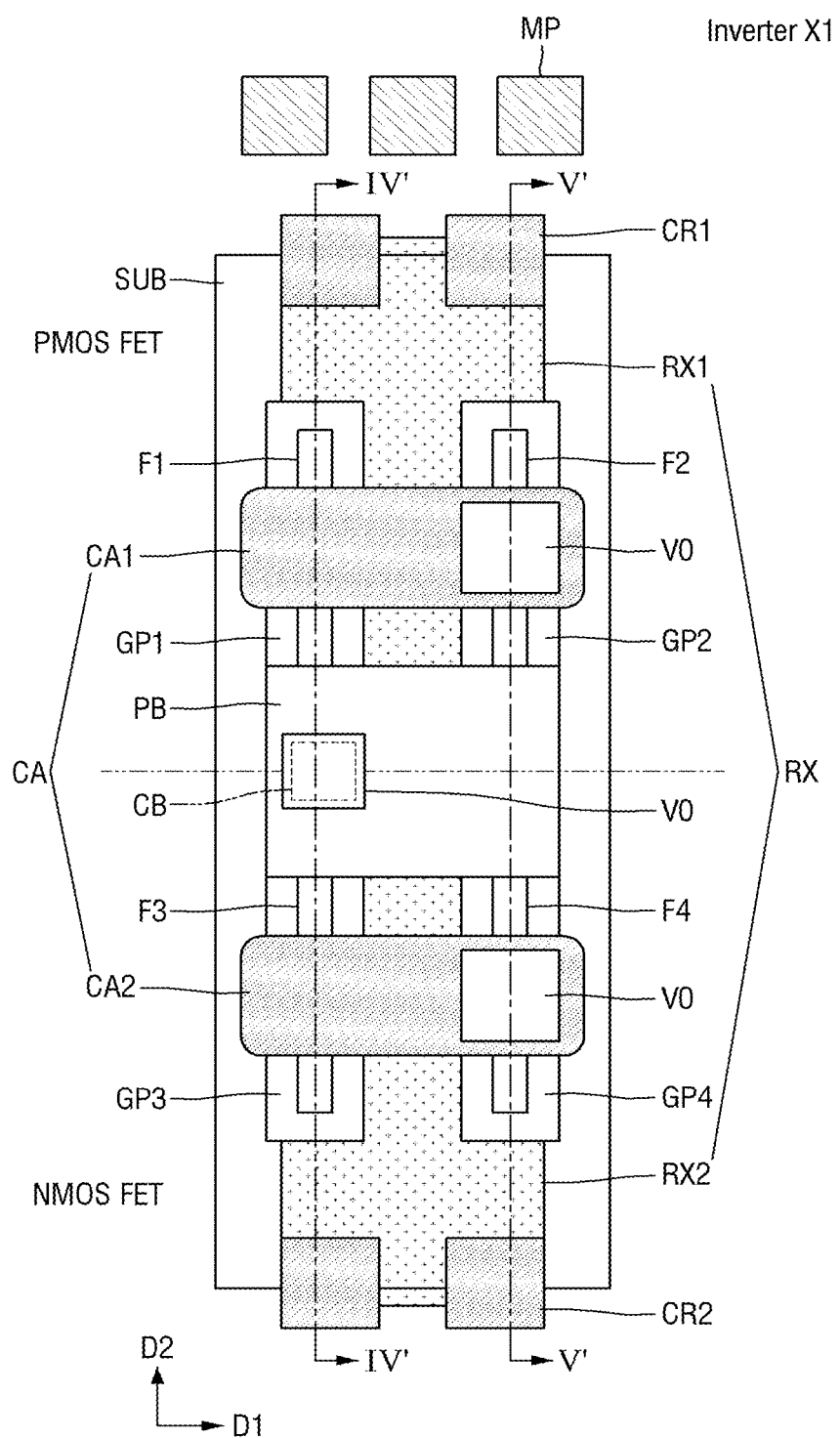
FIG. 3 is a layout of the inverter X1 standard cell of FIG. 2 having a gear ratio of 2:3, according to an example embodiment of the present inventive concepts.
Figure 9A:
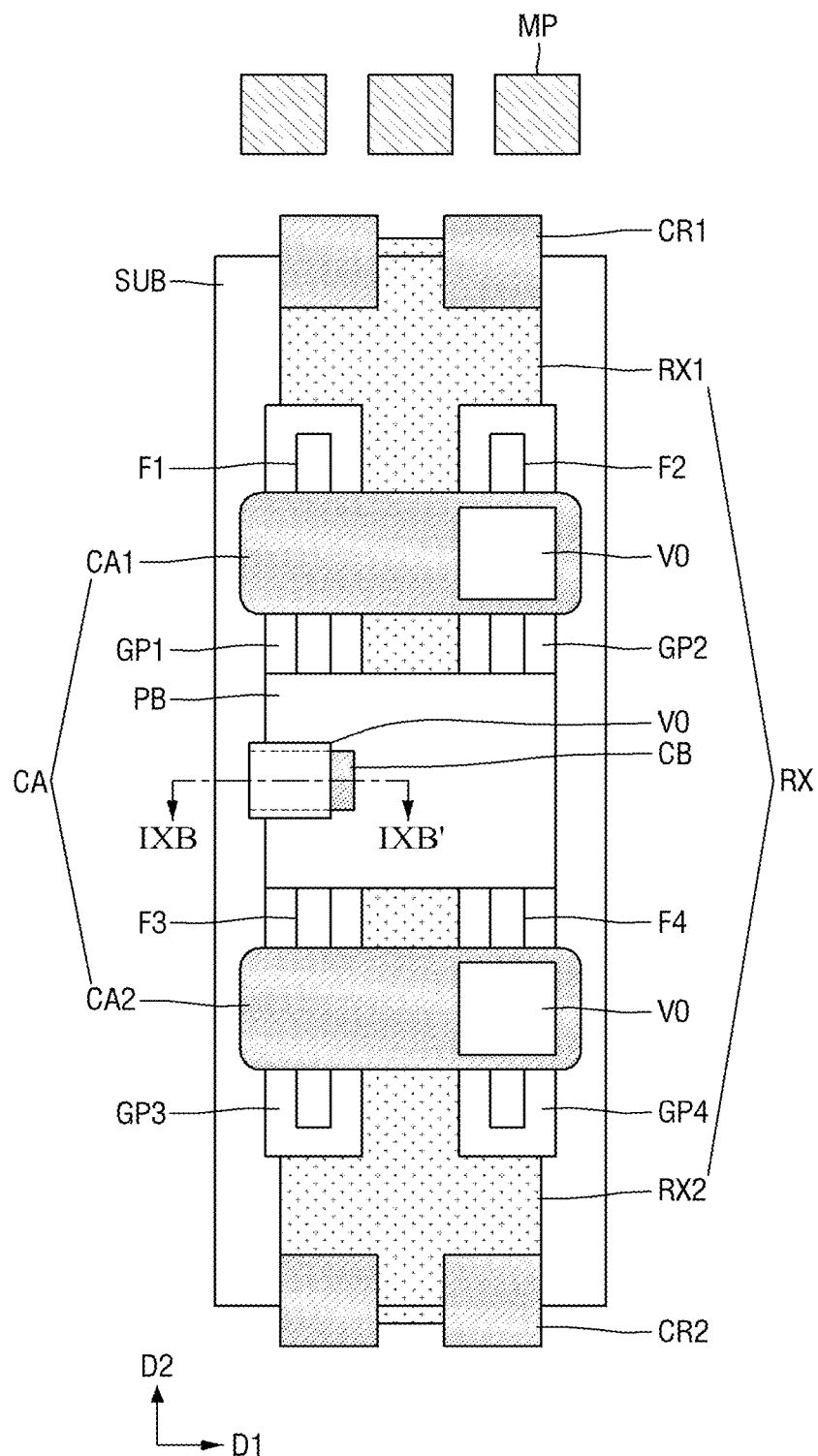
FIG. 9A is a third modified layout of the inverter X1 standard cell of FIG. 3, according to an example embodiment of the present inventive concepts.
Figure 9B:
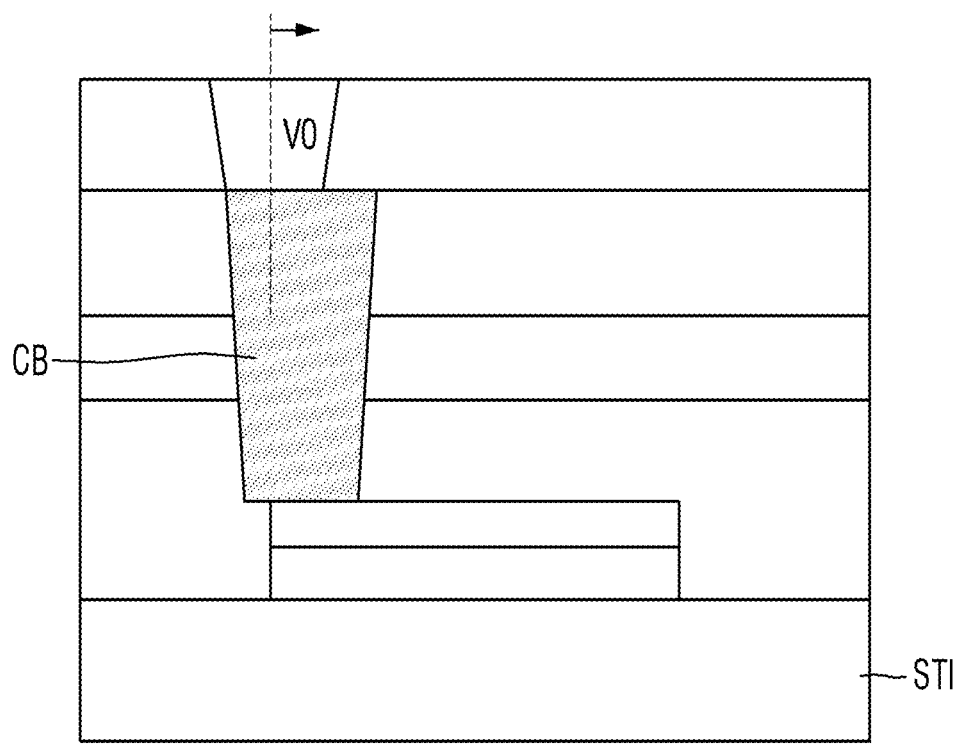
FIG. 9B is a cross-sectional view of the modified layout of FIG. 9A taken along line IXB-IXB', according to an example embodiment of the present inventive concepts.
Figure 9B:
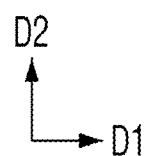

Referring to FIG. 1A, 9 metal layer routing patterns MP are disposed to correspond to 6 gate patterns GP in a unit area. The gate patterns GP may include a first gate portion GP1, a second gate portion GP2, a third gate portion GP3, and a fourth gate portion GP4, as illustrated in FIG. 3, and may be collectively referred to as gate portions. Thus, a gear ration between the GP to MP pitches is 2:3. Referring to FIG. 1B, 6 metal layer routing patterns MP are disposed to correspond to 8 gate patterns GP in a unit area. Thus, a gear ration between the GP to MP pitches is 3:4. Although FIGS. 1A and 1B illustrate examples having 2:3 and 3:4 gear ratios, example embodiments of the present inventive concepts are not limited thereto. According to some example embodiments, gear ratios of 1:2 or other may be implemented.

Figure 2:
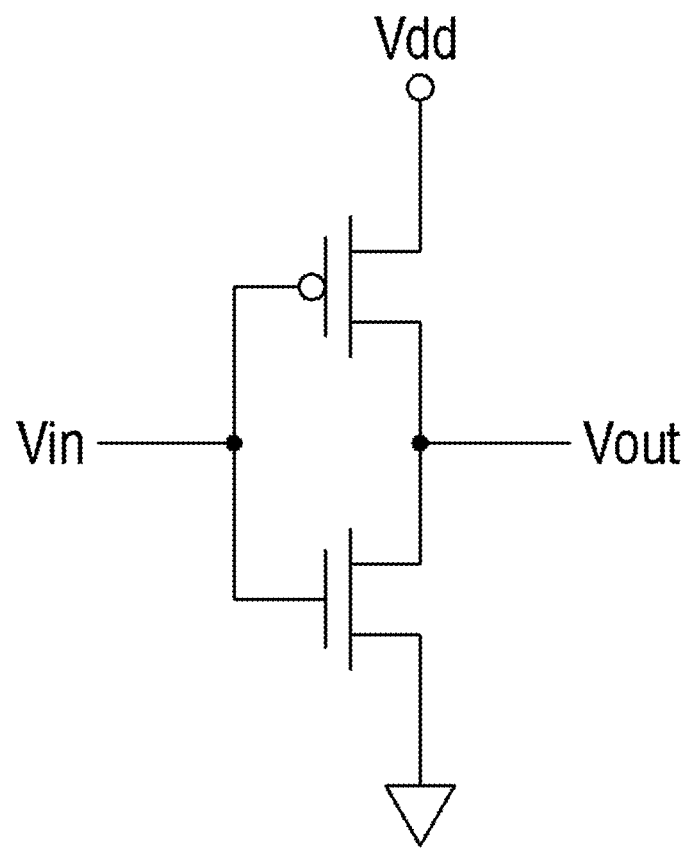
FIG. 2 illustrate a equivalent circuit of an inverter X1 standard cell, according to an example embodiment of the present inventive concepts.

FIG. 2 illustrate an equivalent circuit of an inverter X1 standard cell, according to an example embodiment of the present inventive concepts.

Referring to FIG. 2, the inverter 1X standard cell includes an NMOS field effect transistor (NMOS FET) and a PMOS field effect transistor (PMOS FET). Both gates of the PMOS FET and NMOS FET are commonly connected to an input node Vin, one source/drain (S/D) region of the PMOS FET is connected to a power supply Vdd, the other S/D region of the PMOS FET and one S/D region of NMOS FET are connected to each other and are commonly connected to an output node Vout, the other S/D region of the NMOS FET is connected to ground. According to some example embodiments of the present inventive concepts, the NMOS FET and the PMOS FET of the inverter X1 standard cell are implemented by multi-gate vertical field effect transistors (VFETs), as described in detail herein below.

FIG. 3 is a layout of the inverter X1 standard cell of FIG. 2 having a gear ratio of 2:3, according to an example embodiment of the present inventive concepts. In this layout, the upper half corresponds to the PMOS FET of FIG. 2 and the lower half corresponds to the NMOS FET of FIG. 2.

Referring to FIG. 3, a plurality of fins (e.g., a first fin F1, a second fin F2, a third fin F3, and a fourth fin F4) are provided. The fins F1, F2, F3, and F4 are structures protruding from a substrate SUB. In some example embodiments, the fins F1, F2, F3, and F4 may be provided by growing epitaxial structures at desired positions on the semiconductor substrate SUB.

The first fin F1 and the second fin F2 protrudes from the substrate SUB, are spaced apart from each other in a first direction D1, and are elongated in the second direction D2 crossing (or alternatively, perpendicular to) the first direction D1. The first fin F1 and a second fin F2 collectively function as a channel of the PMOS FET.

The third fin F3 and the fourth fin F4 protrudes from the substrate SUB, are spaced apart from each other in the first direction D1, and are elongated in the second direction D2. The third fin F3 and the fourth fin F4 collectively function as a channel of the NMOS FET. As illustrated, the first fin F1 and the third fin F3 are spaced apart from each other in the second direction D2, and the second fin F2 and the fourth fin F4 are spaced apart from each other in the second direction D2.

A first bottom S/D region RX1 and the second bottom S/D region RX2 (collectively, referred to as first bottom S/D regions RX) are provided on the semiconductor substrate SUB. The bottom S/D regions RX1 and RX2 may be doped differently. For example, the bottom S/D region RX1 in the PMOS FET area may be doped by a p-type dopants (e.g., Boron), and the bottom S/D region RX2 in the NMOS FET area may be doped by an n-type dopants (e.g., Arsenic or Phosphorus).

The first bottom S/D region RX1 (e.g., a layout pattern of the first bottom S/D region RX1) encloses the first fin F1, the second fin F2, a substantial or most portion of the first gate portion GP1, and a substantial or most portion of the second gate portion GP2 when viewed in a plan view. The second bottom S/D region RX2 (e.g., a layout pattern of the second bottom S/D region RX2) encloses the third fin F3, the fourth fin F4, a substantial or most portion of the third gate portion GP3, and a substantial or most portion of the fourth gate portion GP4 when viewed in a plan view.

The first gate pattern GP1, the second gate pattern GP2, the third gate pattern GP3, and the fourth gate pattern GP4 may be formed on sidewalls of the fins F1, F2, F3, and F4, respectively. For example, the gate patterns GP may be formed to surround sidewall of the fins F1, F2, F3, and F4, respectively. The first gate pattern GP1, a second gate pattern GP2, a third gate pattern GP3, and a fourth gate patter GP4 may be collectively referred to as gate patterns GP.

The gate patterns GP each include a gate insulating layer (not shown) and a work function metal layer (not shown) on the gate insulating layer (not shown). In some example embodiments, the gate patterns GP may further include a capping metal layer (not shown) on the work function metal layer.

The gate connecting structure PB may be provided to connect the first gate pattern GP1, the second gate pattern GP2, the third gate pattern GP3, and the fourth gate pattern GP4 to each other. The gate connecting structure PB and the first gate pattern GP1, the second gate pattern GP2, the third gate pattern GP3, and the fourth gate pattern GP4 may form an integral structure, which includes respective portions corresponding to the gate connecting structure PB and the first gate pattern GP1, the second gate pattern GP2, the third gate pattern GP3, and the fourth gate pattern GP4.

Although not shown in this layout, a first top S/D region (not shown), a second top S/D region (not shown), a third top S/D region (not shown), a fourth top S/D region (not shown) may be provided on the first, second, third, and fourth fins F1, F2, F3, and F4, respectively.

A first top S/D contact structure CA1 may be provided to cover both a portion of the first top S/D region on the first fin F1 and a portion of the second top S/D region on the second fin F2, and to be connected to both the first top S/D region on the first fin F1 and the second top S/D region on the second fin F2. A second top S/D contact structure CA2 may be provided to cover both a portion of the third top S/D region on the third fin F3 and a portion of the fourth top S/D region on the fourth fin F4, and to be connected to both the third top S/D region on the third fin F3, and on the fourth top S/D region on the fourth fin F3.

The first top S/D contact structure CA1 may be connected to the first top S/D region and the second top S/D region. The second top S/D contact structure CA2 may be connected to the third top S/D region and the fourth top S/D region. The first top S/D contact structure CA1 and the second top S/D contact structure CA2 may be elongated in the first direction D1 (e.g., a direction along which the first fin F1 and the second fin F2 (as well as the third fin F3 and the fourth fin F4) are arranged). The first top S/D contact structure CA1 and the second top S/D region CA1 may be collectively referred to as top S/D contact structures CA.

Accordingly, the first top S/D contact structure CA1 and the second top S/D contact structure CA2 may function as a horizontal conductive routing layer (or alternatively, a first conductive routing layer running in the first direction D1) of the layout.

A gate contact structure CB may be provided on the gate connecting structure PB such that the gate contact structure CB is connected to the gate connecting structure PB. Referring to the example embodiment illustrated in FIG. 3, the gate contact structure CB is provided on the gate connecting structure PB at an area between the first fin F1 and the third fin in the second direction D2. The gate contact structure CB may be spaced apart from the first, second, third, and fourth fin F1, F2, F3, and F4 when viewed in a plan view, while being connected to the gate connecting structure PB.

A first bottom S/D contact structure CR1 may be provided on the first bottom S/D region RX1 to contact the first bottom S/D region RX1. A second bottom S/D contact structure CA2 may be provided on the second bottom S/D region RX2 to contact the second bottom S/D region RX2. The first bottom S/D contact structure CR1 and the second bottom S/D contact structure CR2 may be collectively referred to as bottom S/D contact structures CR.

All or some of a plurality of metal patterns MP may be connected to corresponding ones of the gate contact structure CB and the first and second top S/D contact structures CA1 and CA2 through corresponding ones of a plurality of vias V0, respectively. The plurality of metal patterns MP may be elongated in the second direction D2 (e.g., an elongation direction of the fins F1, F2, F3, and F4). Thus, the plurality of metal patterns MP may function as a vertical conductive routing layer (or alternatively, a second conductive routing layer running in the second direction D2) of the layout.

Accordingly, an inverter X1 standard cell including the PMOS FET and the NMOS FET each having a vertical channel implemented by two fins may be provided. In other words, an inverter X1 standard cell including multi-gate NMOS VFET and multi-gate PMOS VFET may be provided. Although FIG. 3 illustrates an example in which each of the respective channels are provided to include two fins, example embodiments of the present inventive concepts are not limited thereto. According to some example embodiments, a vertical channel of a VFET may be implemented by three or more fins.

Figure 4:
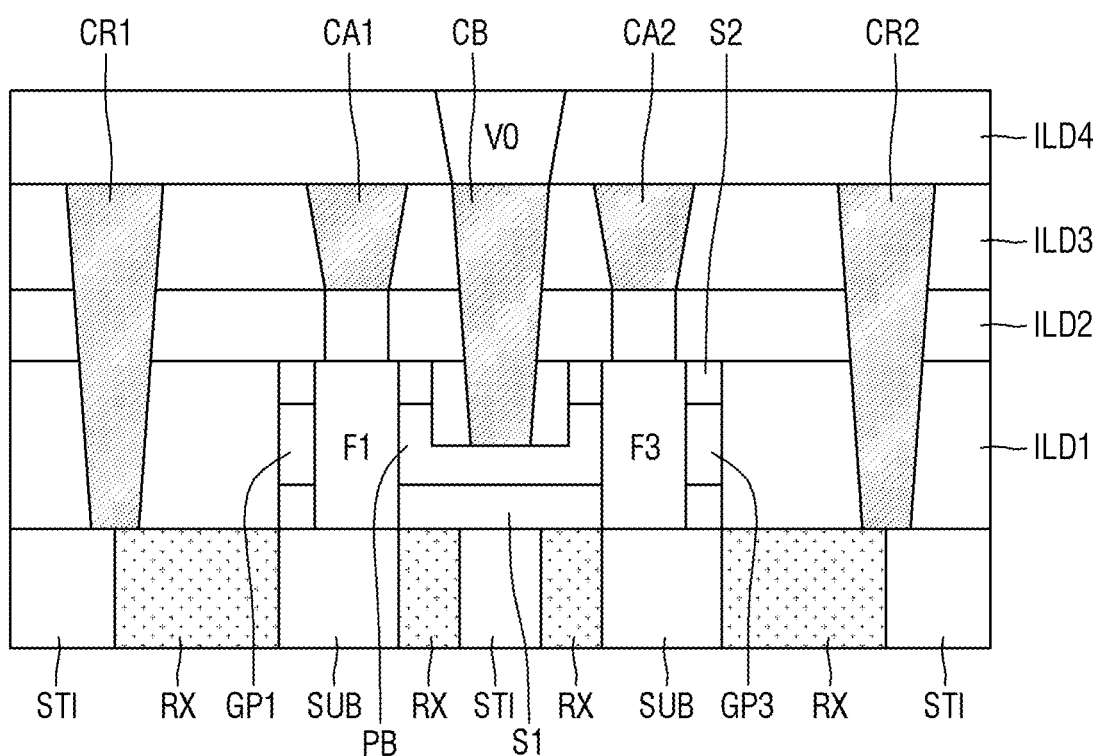
FIG. 4 is a cross-section view of the inverter of FIG. 3 taken along line IV-IV', according to an example embodiment of the present inventive concepts.
Figure 5:
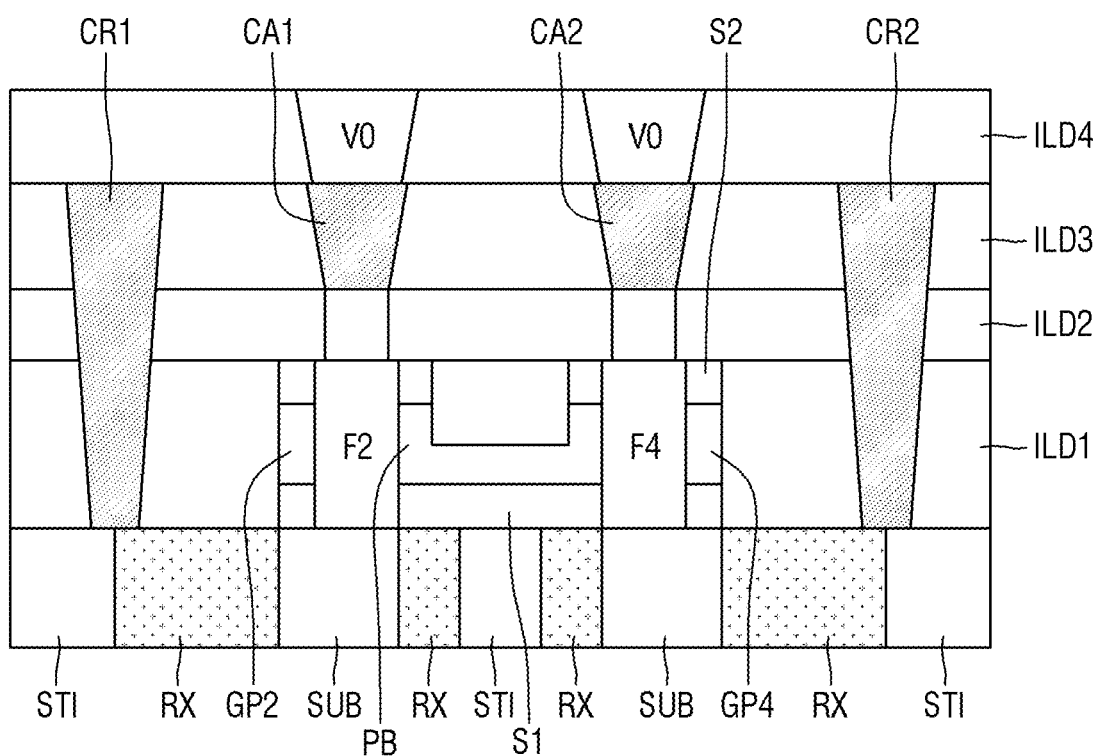
FIG. 5 is a cross-section view of the inverter of FIG. 3 taken along line V-V', according to an example embodiment of the present inventive concepts.

FIG. 4 is a cross-section view of the inverter of FIG. 3 taken along line IV-IV', according to an example embodiment of the present inventive concepts. FIG. 5 is a cross-section view of the inverter of FIG. 3 taken along line V-V', according to an example embodiment of the present inventive concepts.

Referring to FIGS. 4 and 5, the bottom S/D regions RX are surrounded by (or are isolated from each other by), for example, shallow trench isolation regions STI on the substrate SUB. The first gate pattern GP1 surrounds a sidewall of the first fin F1. The third gate pattern GP3 surrounds a sidewall of the third fin F3. Lower surfaces of the first gate pattern GP1, the third gate pattern GP3, and the gate connecting structure PB are insulated from the substrate SUB by a bottom spacer layer 51. Upper surfaces of the first gate pattern GP1 and the third gate pattern GP3 are insulated by an upper spacer layer S2. Further, interlayer dielectric layers ILD1, ILD2, ILD3, and ILD4 (collectively, referred to as ILD) may be formed to provide proper insulation between conductive layers. The interlayer dielectric layers ILD1, ILD2, ILD3, and ILD4 may include a nitride material or an oxide material depending on desired etching and/or insulation characteristics.

FIGS. 6A-6G are layouts to explain a method of manufacturing the inverter X1 standard cell of FIGS. 3-5, according to an example embodiment of the present inventive concepts.

Figure 6A:
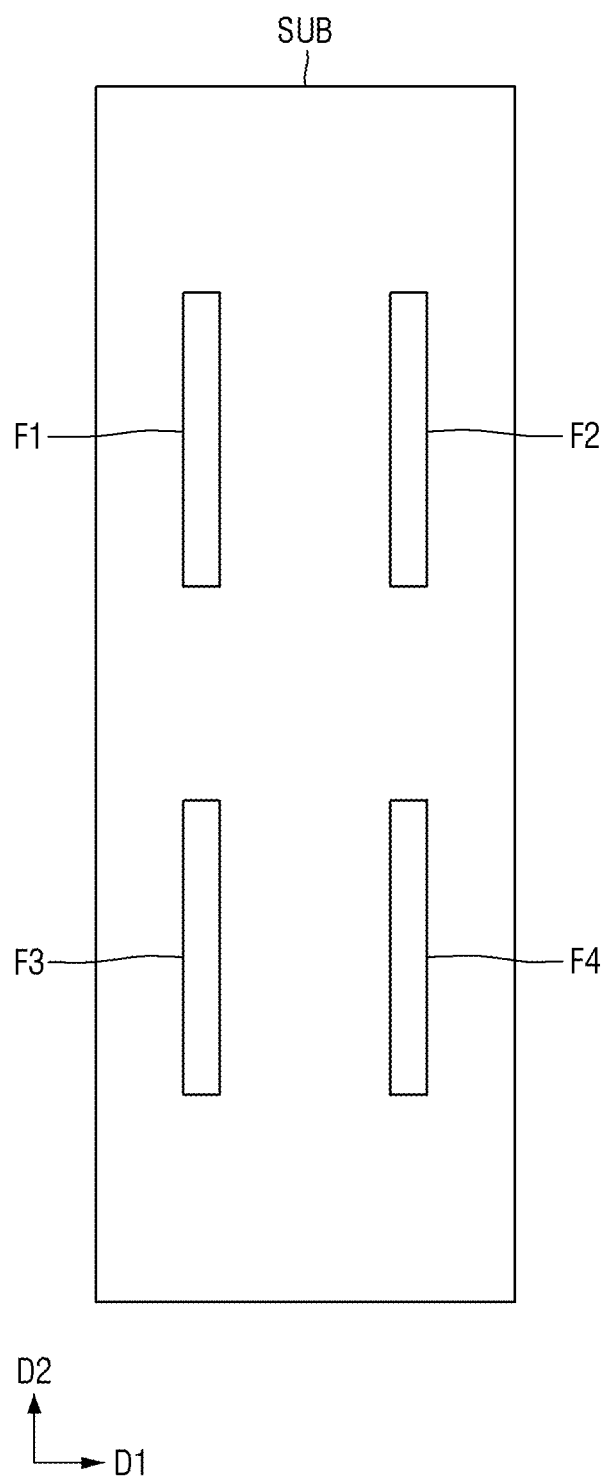
FIGS. 6A-6G are layouts to explain a method of manufacturing the inverter X1 standard cell of FIGS. 3-5, according to an example embodiment of the present inventive concepts.

Referring to FIG. 6A, the plurality of fins (e.g., a first fin F1, a second fin F2, a third fin F3, and a fourth fin F4) are formed on the substrate SUB. The fins F1, F2, F3, and F4 are structures protruding from the semiconductor substrate SUB. In some example embodiments, the fins F1, F2, F3, and F4 may be formed using an epitaxial growth process on the substrate SUB.

The first fin F1 and the second fin F2 (as well as the third fin F3 and the fourth fin F4) may be formed to be spaced apart in the first direction D1. Further, the first fin F1 and the third fin F3 (as well as the second fin F2 and the fourth fin F4) may be formed to be spaced apart in the second direction D2 crossing (or alternatively, perpendicular to) the first direction D1. Further, the fins F1, F2, F3, and F may be formed to be elongated in the second direction D2.

The substrate SUB may be a bulk silicon. For example, the substrate SUB may be a silicon substrate, or may include a material other than silicon, including but not limited to Ge, SiGe, SiC, GeP, GeN, InGaAs, GaAs, InSb, InAs, GaSb, and InP. The semiconductor substrate SUB may be a portion of a bulk silicon wafer. The substrate SUB may be a silicon-on-insulator (SOI). The substrate SUB may be a silicon portion of a Silicon-On-Insulator (SOI) wafer. In some example embodiments, the substrate SUB may refer to a semiconductor layer epitaxially grown on a base substrate.

Figure 6B:
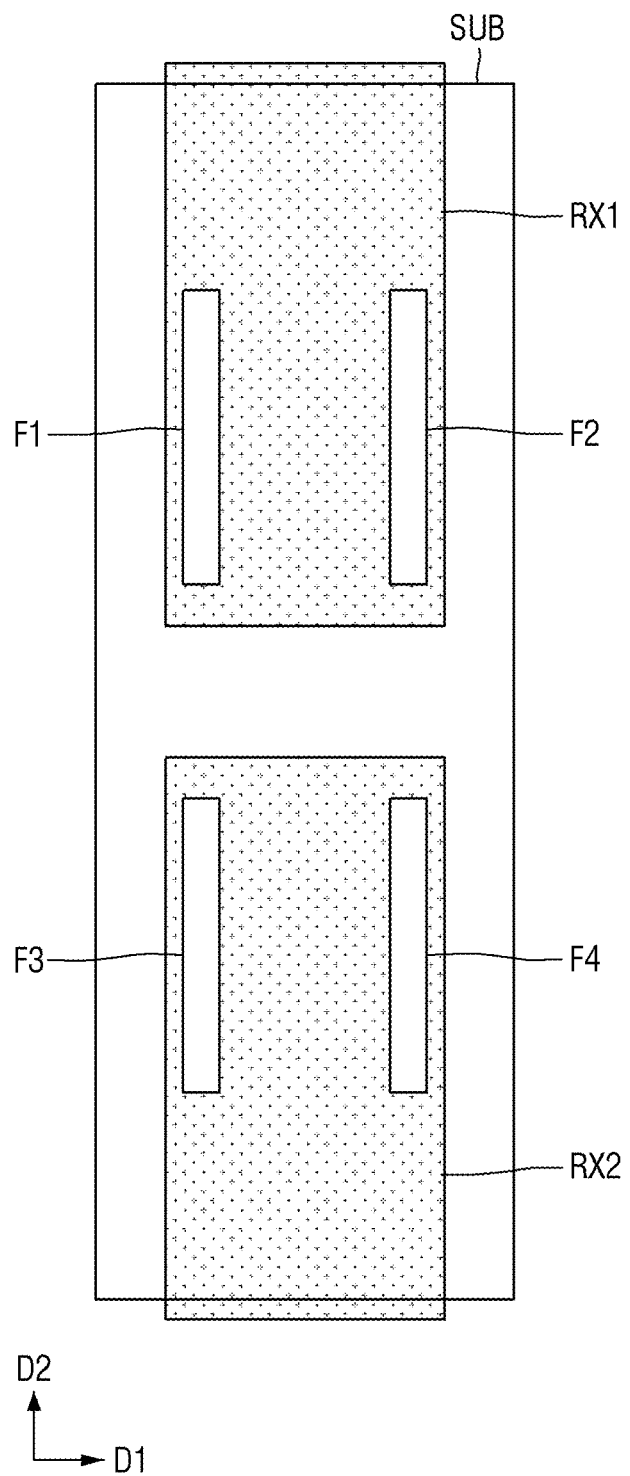

Referring to FIG. 6B, the first bottom S/D region RX1 and the second bottom S/D region RX2 are provided on the semiconductor substrate SUB. According to some example embodiments, the Bottom S/D regions RX1 and RX2 may be formed by etching the substrate SUB to a certain depth using the fins F1, F2, F3, F4 and a hard mask pattern (not shown) thereon (together with an additional mask pattern covering an entire area of the substrate SUB except for areas at which the first and second bottom S/D regions RX1 and RX2 are to be defined) as an etch mask. Then, a semiconductor material layer may be epitaxially grown in recessed areas defined by the etching, and doped with different dopants to form the first bottom S/D region RX1 for the PMOS FET and the second bottom S/D region RX2 for the NMOS FET, respectively.

The first and second bottom S/D regions RX1 and RX2 may be doped differently by using an additional mask as an implant mask. For example, the first bottom S/D region RX1 in the PMOS FET area may be doped by a p-type dopants (e.g., Boron), and the second bottom S/D region RX2 in the NMOS FET area may be doped by an n-type dopants (e.g., Arsenic or Phosphorus).

Figure 6C:
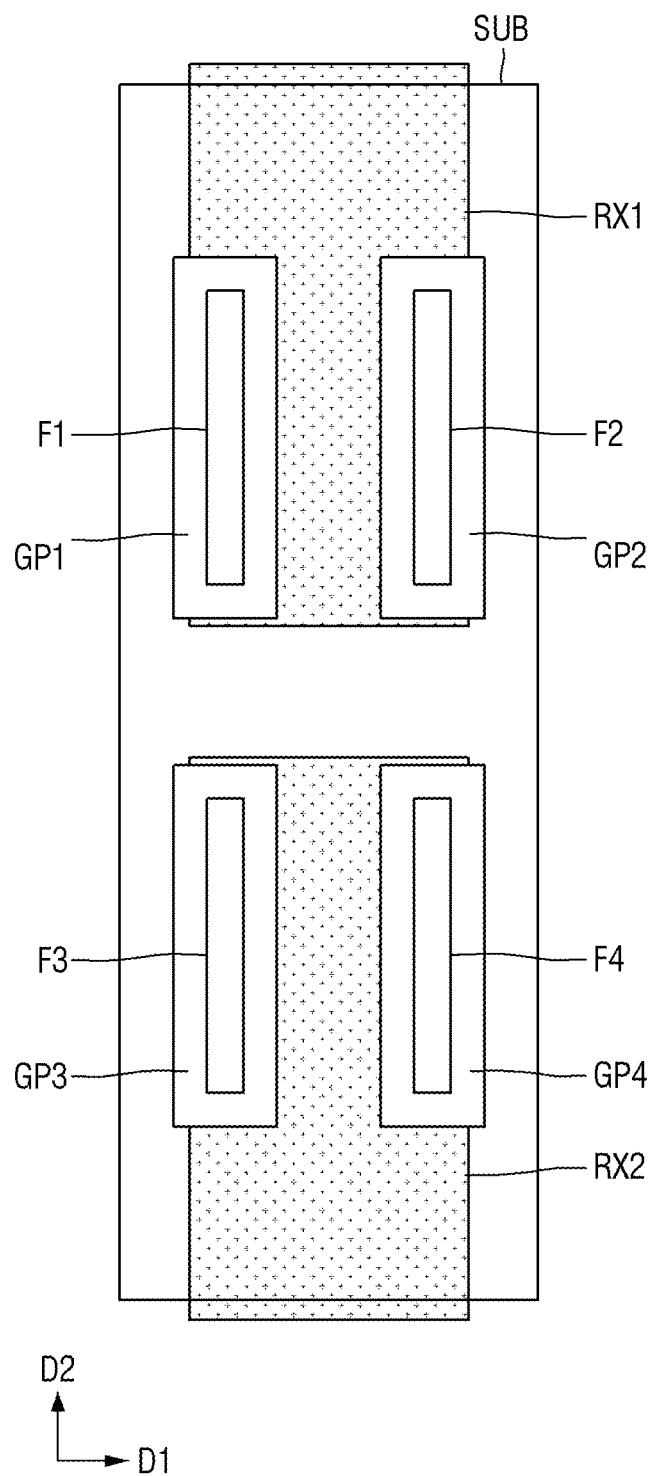
Figure 6D:
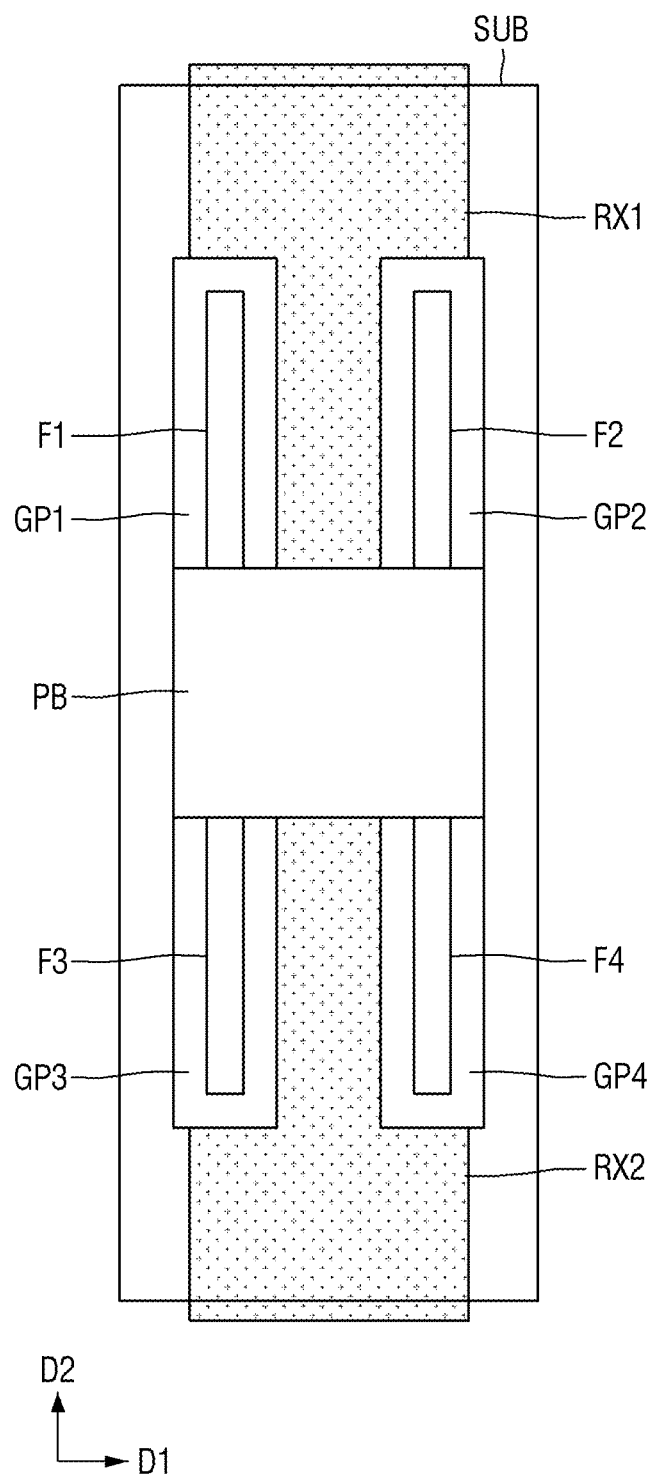

Referring to FIG. 6C, the gate patterns GP (e.g., a first gate pattern GP1, a second gate pattern GP2, a third gate pattern GP3, and a fourth gate pattern GP4) may be formed on sidewalls of the fins F1, F2, F3, and F4, respectively. For example, the gate patterns GP may be formed to surround sidewall of the fins F1, F2, F3, and F4, respectively. The gate patterns GP each include a gate insulating layer (not shown) and a work function metal layer (not shown) on the gate insulating layer in some example embodiments, the gate patterns GP may further include a capping metal layer (not shown) on the work function metal layer.

The gate insulating layer may include a high-k dielectric material.

The work function metal layer may include TiN. In some example embodiments, the work function metal layer may include titanium nitride (TiN) or titanium carbide (TiC). A work function of the work function metal layer for a VFET may be determined based on material characteristics as well as a thickness of the work function metal layer. In some example embodiments, the work function metal layer may be implemented to have different thicknesses depending on locations.

The capping metal layer may be subsequently formed on the work function metal layer. The capping metal layer may include at least one of TiC, TiAlC, or TiAl Referring to FIG. 6D, the gate connecting structure PB is formed on the first gate pattern GP1, the second gate pattern GP2, the third gate pattern GP3, and the fourth gate pattern GP4 and connected thereto. The gate connecting structure PB is a structure connecting the first gate pattern GP1, the second gate pattern GP2, the third gate pattern GP3, and the fourth gate pattern GP4 to each other. The gate connecting structure PB and the first gate pattern GP1, the second gate pattern GP2, the third gate pattern GP3, and the fourth gate pattern GP4 may be an integral structure, which includes respective portions corresponding to the gate connecting structure PB and the first gate pattern GP1, the second gate pattern GP2, the third gate pattern GP3, and the fourth gate pattern GP4. The gate connecting structure PB and the first gate pattern GP1, the second gate pattern GP2, the third gate pattern GP3, and the fourth gate pattern GP4 may include a same material.

Although not specifically illustrated in the drawings, the first top S/D region (not shown), the second top S/D region (not shown), the third top S/D region (not shown), the fourth top S/D region (not shown) may be provided on the first, second, third, and fourth fins F1, F2, F3, and F4, respectively.

The first, second, third, and fourth top S/D regions may be formed by epitaxially growing p+ or n+ doped semiconductor layers on corresponding ones of the first, second, third, and fourth fins F1, F2, F3, and F4, respectively. However, example embodiments of the present inventive concepts are not limited thereto. According to some example embodiments of the present inventive concepts, the first, second, third, and fourth top S/D regions may be formed by implanting desired dopants onto the first, second, third, and fourth fins F1, F2, F3, and F4, respectively.

Figure 6E:
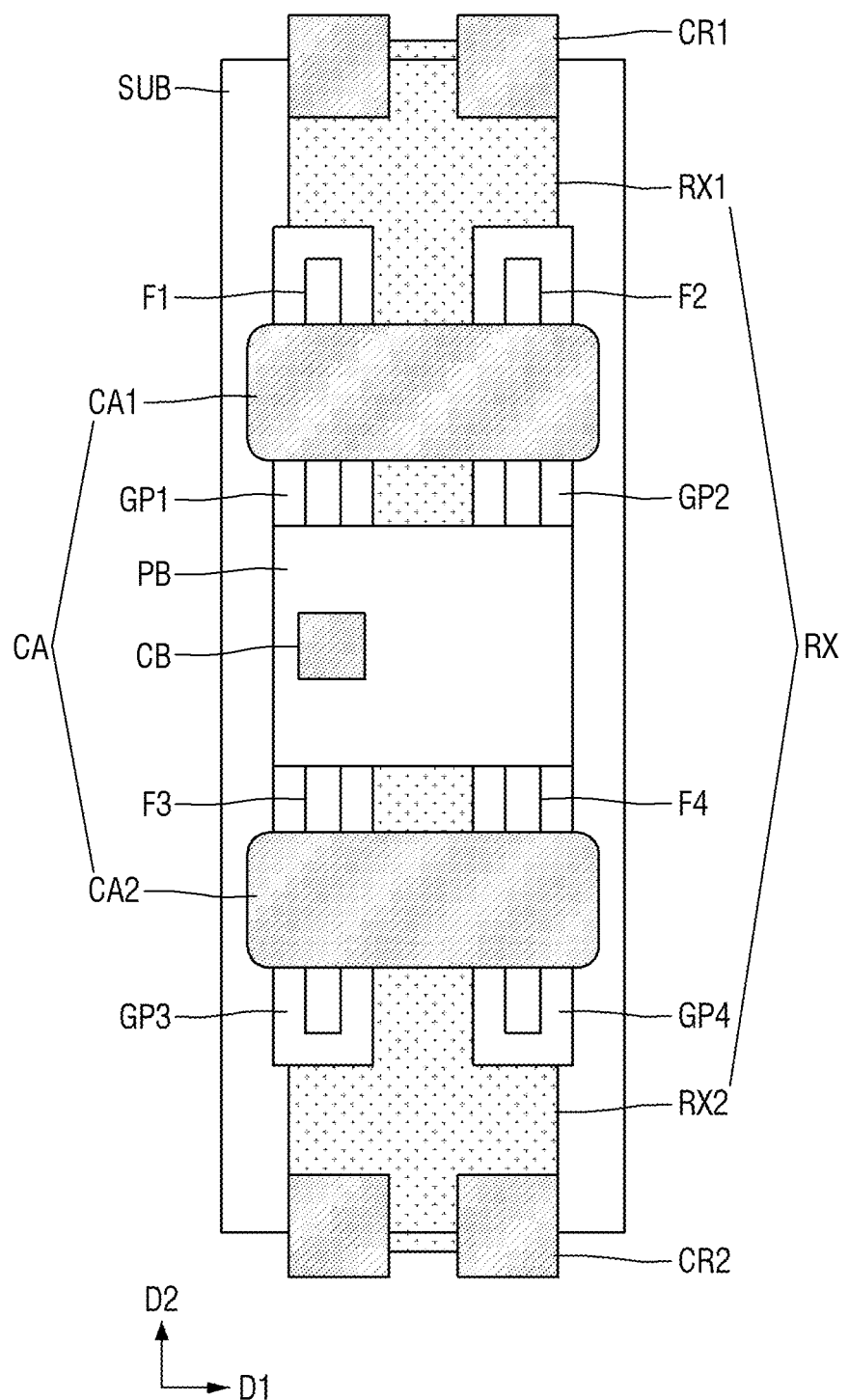

Referring to FIG. 6E, the first top S/D contact structure CA1 is formed to cover both the first top S/D region on the first fin F1 and the second top S/D region on the second fin F2, and to be electrically connected to both the first top S/D region on the first fin F1 and the second top S/D region on the second fin F2. The second top S/D contact structure CA2 may be provided to cover both the third top S/D region on the third fin F3 and the fourth top S/D region on the fourth fin F4, and to be electrically connected to both the third top S/D region on the third fin F3 and the fourth top S/D region on the fourth fin F4. The first top S/D contact structure CA1 and the second top S/D contact structure CA2 may include a conductive material such as metal.

The first top S/D contact structure CA1 and the second top S/D contact structure CA2 may function as a horizontal conductive routing layer of the layout. The first top S/D contact structure CA1 and the second top S/D contact structure CA2 may be elongated in the first direction D2, and function as a first conductive routing layer running in the first direction D1 (e.g., a direction along which the first fin F1 and the second fin F2 (or the third fin F3 and the fourth fin F4 are arranged).

The gate contact structure CB may be formed on the gate connecting structure PB such that the gate contact structure CB is electrically connected to the gate connecting structure PB. According to the example embodiment, the gate contact structure CB is formed on the gate connecting structure PB at an area between the first fin F1 and the third fin in the second direction D2. The gate contact structure CB may be formed to be spaced apart from the first, second, third, and fourth fin F1, F2, F3, and F4 when viewed in a plan view, while being connected to the gate connecting structure PB. The gate contact structure CB may include a conductive material such as metal.

The first bottom S/D contact structure CR1 may be formed on the first bottom S/D region RX1 to be electrically connected to the first bottom S/D region RX1. The second bottom S/D contact structure CA2 may be formed on the second bottom S/D region RX2 to be electrically connected to the second bottom S/D region RX2. The first bottom S/D contact structure CR1 and the second bottom S/D contact structure CR2 may include a conductive material such as metal.

The first top S/D contact structure CA1, the second top S/D contact structure CA2, the gate contact structure CB, the first bottom S/D contact structure CR1, and the second bottom S/D contact structure CR2 may include a same material. The first top S/D contact structure CA1, the second top S/D contact structure CA2, the gate contact structure CB, the first bottom S/D contact structure CR1, and the second bottom S/D contact structure CR2 may be simultaneously formed in a same process. As illustrated in FIGS. 4 and 5, top surfaces of the first top S/D contact structure CA1, the second top S/D contact structure CA2, the gate contact structure CB, the first bottom S/D contact structure CR1, and the second bottom S/D contact structure CR2 may be formed at a substantially same level with respect to (or alternatively, from) a top surface of the substrate SUB.

Figure 6F:
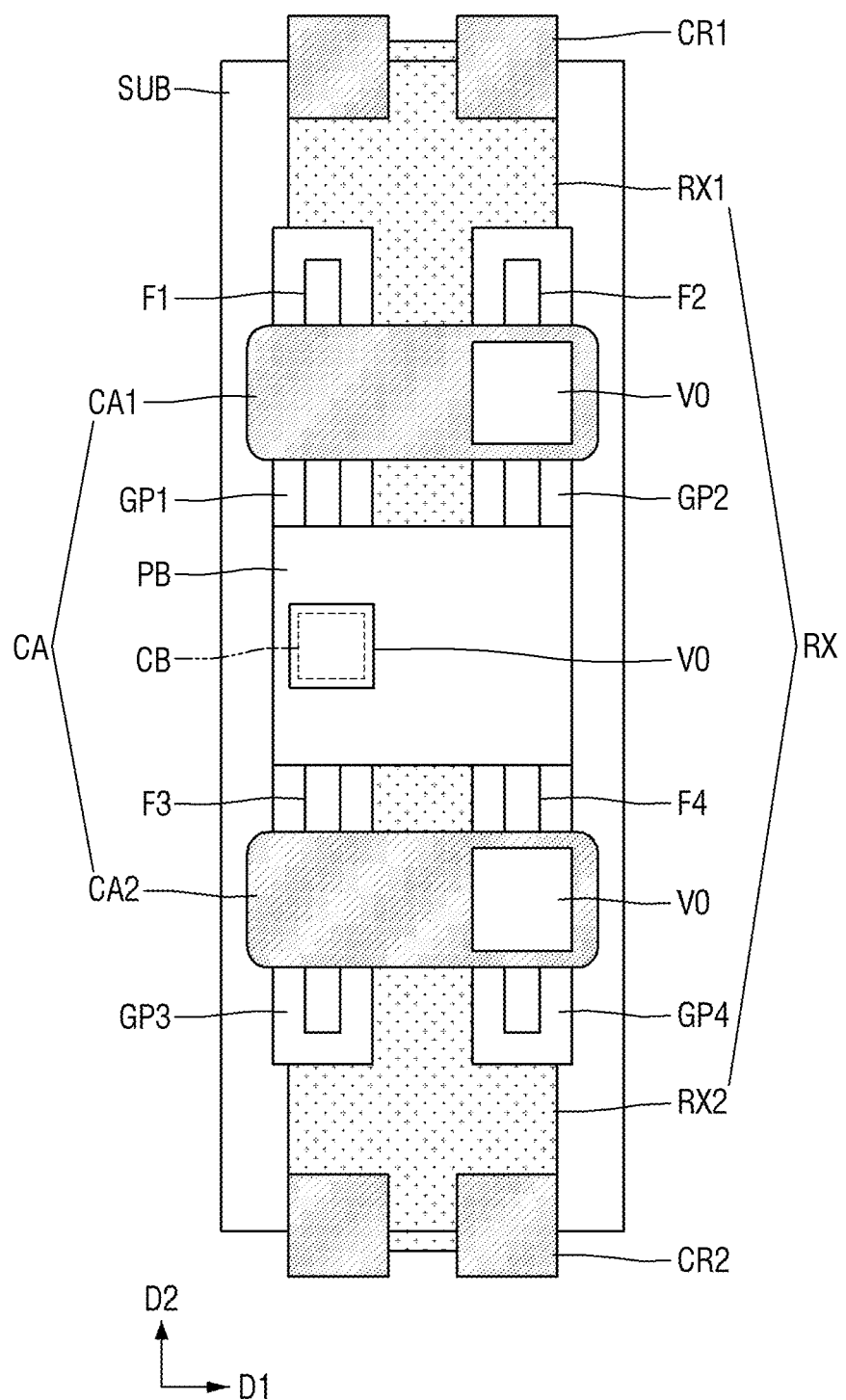

Referring to FIG. 6F, the plurality of vias V0 are formed on the first top S/D contact structure CA1, the second top S/D contact structure CA2, and the gate contact structure CB, respectively.

Figure 6G:
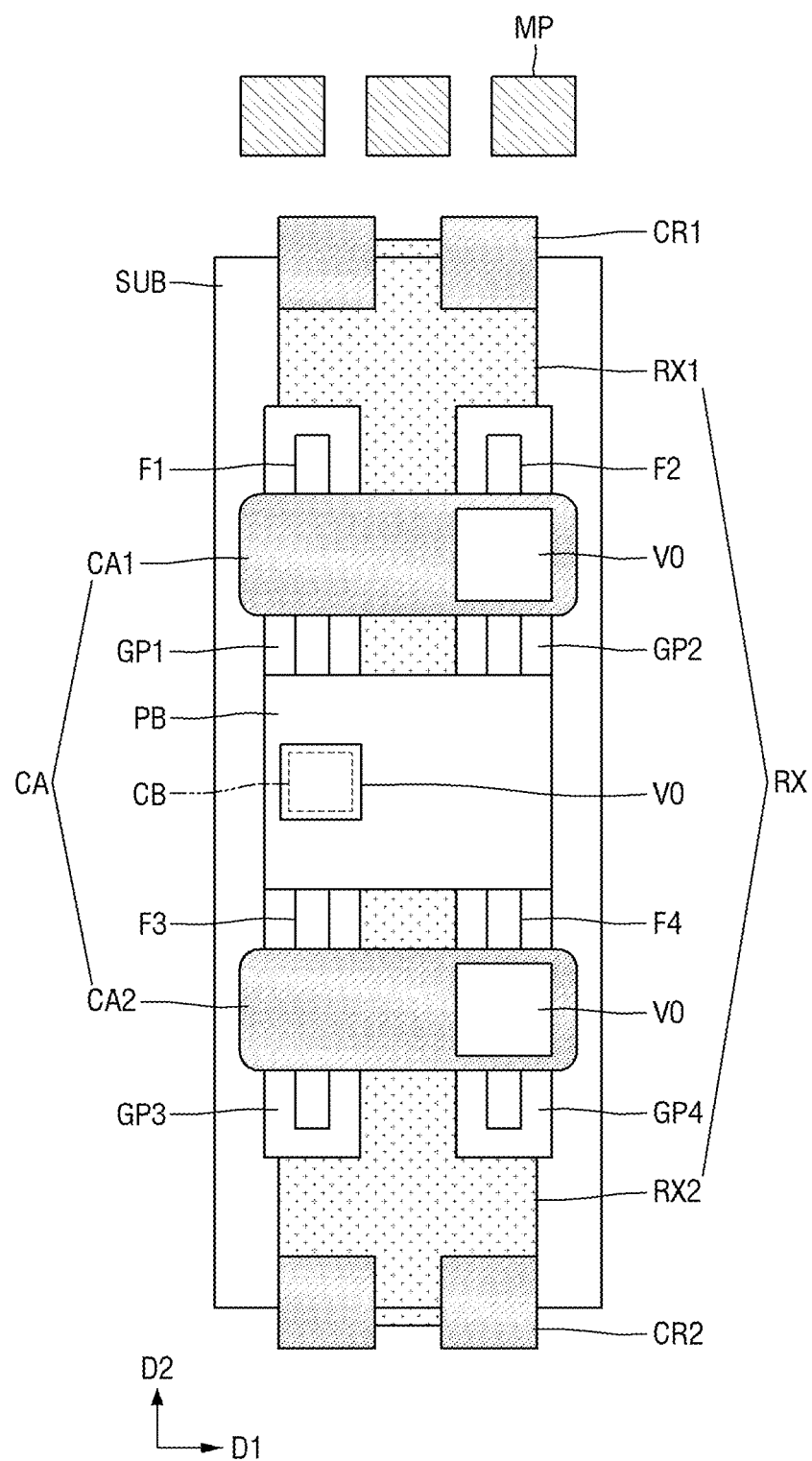

Referring FIG. 6G, the plurality of metal patterns MP are formed to correspond to the plurality of vias V0. Although not illustrated in FIG. 6G, at least some of the plurality of metal patterns MP may be formed to be elongated in a direction (e.g., the second direction D2) along which the fins F1, F2, F3, and F4 are elongated so that the at least some of the plurality of metal patterns MP are electrically connected to corresponding ones of the plurality of vias V0. Accordingly, the at least some of the plurality of metal patterns MP may be connected to corresponding ones of the gate contact structure CB and the first and second top S/D contact structures CA1 and CA2 through the plurality of vias V0. Thus, the plurality of metal patterns MP functions as a vertical conductive routing layer of the layout. The plurality of metal patterns MP are elongated in the second direction D2 and functions as a second conductive routing layer in the second direction D2 (e.g., a direction along which the first, second, third, and fourth fins F1, F2, F3, and F4 are elongated).

According to the example embodiment, an inverter standard cell including the PMOS FET and the NMOS FET each having a vertical channel implemented by two fins may be provided. In other words, an inverter standard cell including multi-gate NMOS VFET and multi-gate PMOS VFET may be provided.

According to the example embodiment, an inverter standard cell having a gear ratio of 2:3 may be provided. In some example embodiments, gear ratios (e.g., 1:2 or 3:4) may be implemented.

In a VFET, a fin vertically protruding from a substrate functions as a channel and a structure surrounding a sidewall of the fin functions as a gate. Thus, the top S/D contact structure connected to the top S/D of the VFET and the bottom S/D contact structure connected to the bottom S/D of the VFET are less affected by an area occupied by the gate (meaning more design freedom or layout tolerance) compared to conventional planar or horizontal field effect transistors.

According the multi-gate VFET of the example embodiment, two or more fins function as a channel of the VFET, and gate patterns surrounding respective fins functions as a gate and are connected to each other using a gate connecting pattern therebetween. Accordingly, the multi-gate VFET may provide a larger area for each of a gate contact structure, a top S/D contact structure, and/or a bottom S/D contact structure than a single-gate VFET or conventional planar or horizontal field effect transistors Thus, according to the example embodiment, a standard cell having a gear ratio of m:n (where m and n are natural numbers, and n is greater than m) can be implemented without using two crossing metal routing layers (e.g., a lower metal routing layer and an upper metal routing layer that crosses the lower vertical metal routing layer and is connected to the lower metal routing layer thorough a via). Thus, a standard cell having a gear ratio of m:n (where m and n are natural numbers, and n is greater than m) can be implemented using a single metal routing layer.

Figure 7A:
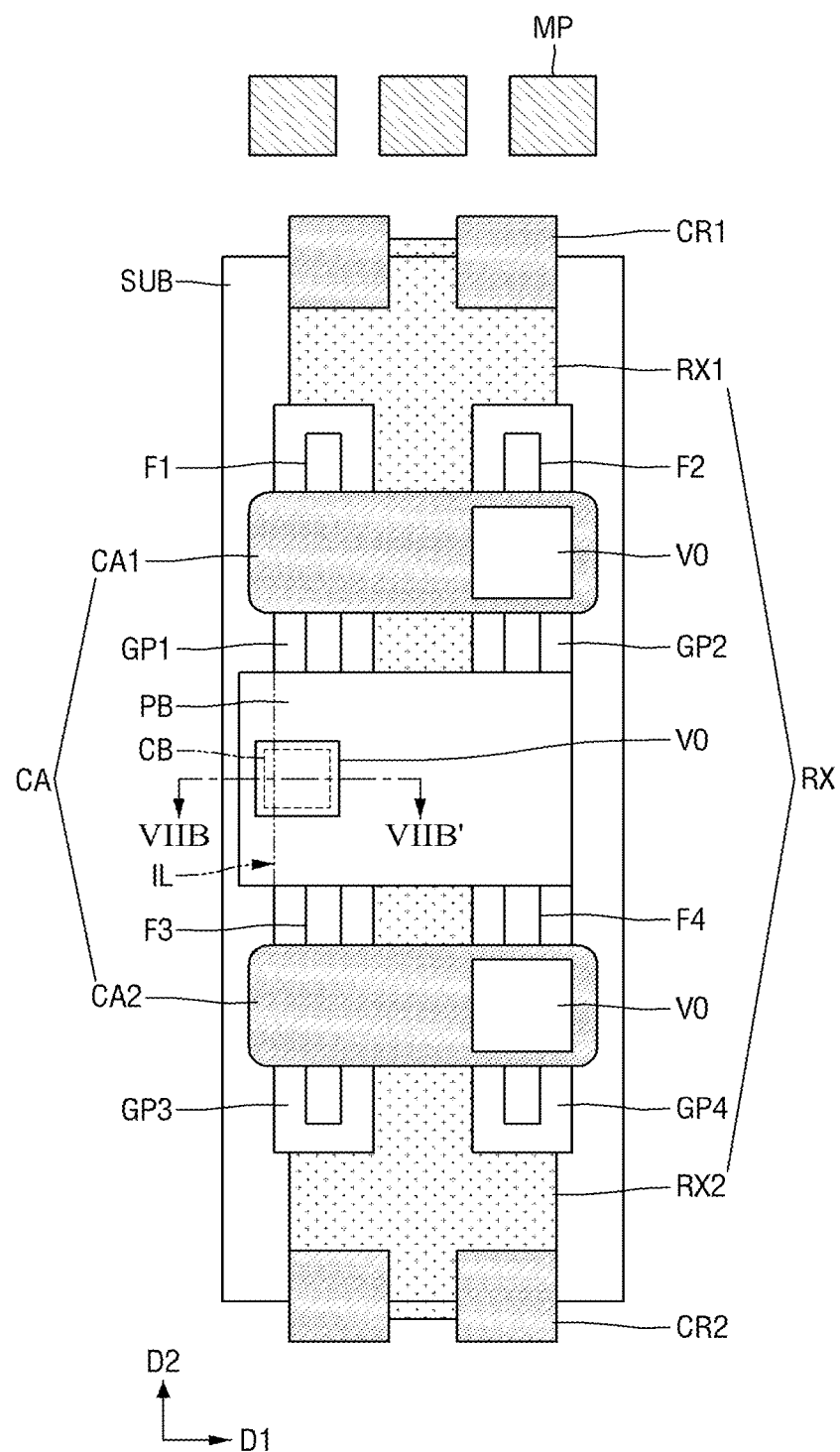
FIG. 7A is a first modified layout of the inverter X1 standard cell of FIG. 3, according to an example embodiment of the present inventive concepts.
Figure 7B:
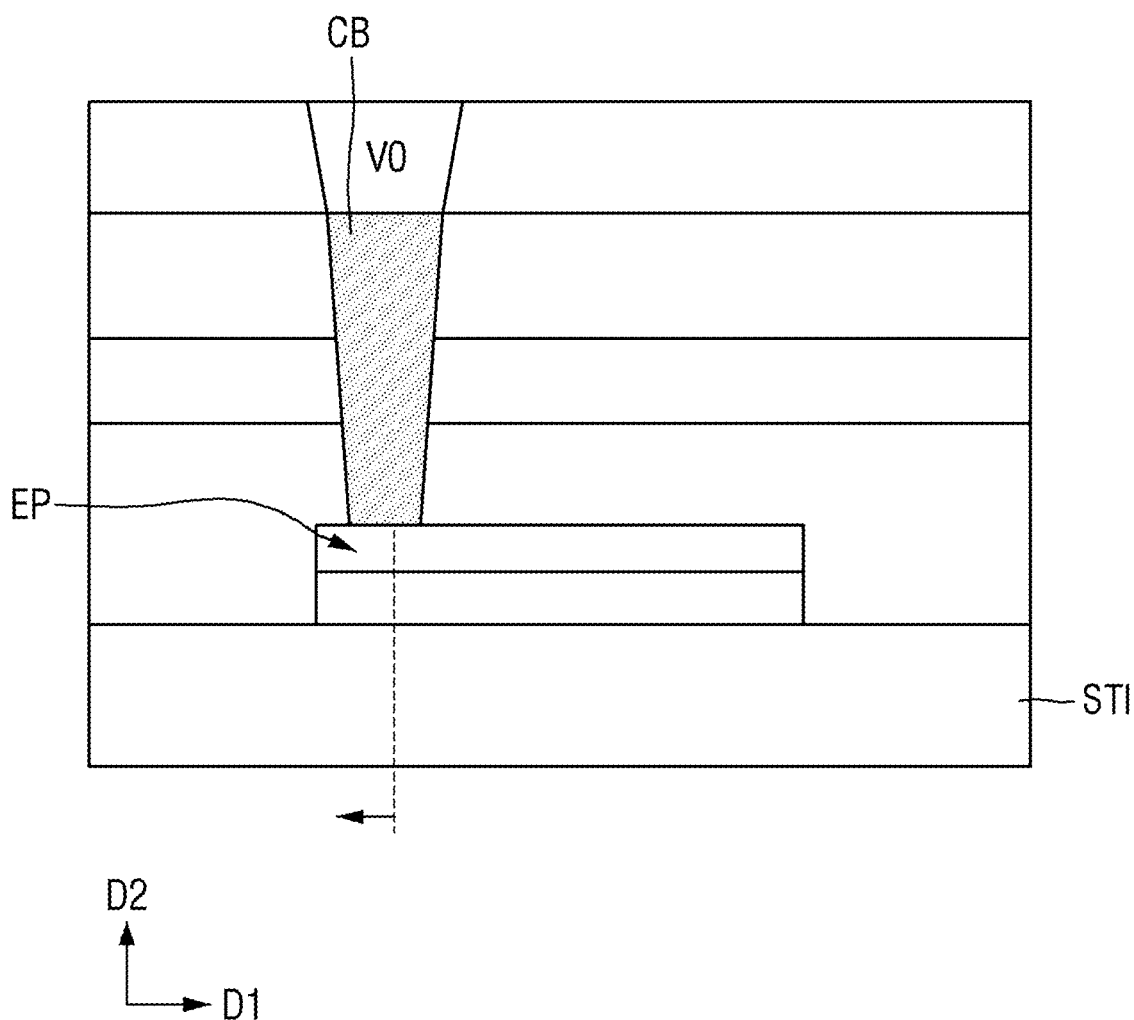
FIG. 7B is a cross-sectional view of the modified layout of FIG. 7A taken along line VIIB-VIIB', according to an example embodiment of the present inventive concepts.

FIG. 7A is a first modified layout of the inverter X1 standard cell of FIG. 3, according to an example embodiment of the present inventive concepts. FIG. 7B is a cross-sectional view of the modified layout of FIG. 7A taken along line VIIB-VIIB', according to an example embodiment of the present inventive concepts.

Referring to FIG. 7A, the gate connecting structure PB is provided at an area between the PMOS VFET and the NMOS VFET and connecting the first, second, third, and fourth gate portions GP1, GP2, GP3, and GP4 to each other. The gate connection layer PB has a shape enclosing end portions of each of the first, second, third, and fourth fins F1, F2, F3, and F4, which face each other in at least one of the first direction D1, the second direction D2, or a diagonal direction between the first direction D1 and the second direction D2.

As illustrated in FIG. 7A, to secure a sufficient space (which is desired for implementing a uniform metal pitch) for a via V0 connecting to an underlying gate contact structure CB, the standard cell layout may be modified such that the gate connecting structure PB includes an extended portion EP, which extends beyond a side of the bottom S/D in the first direction D1.

In some example embodiments, at least one side of the gate connecting structure PB may include an extension portion in the first direction D1. The extension portion (or extension area) may lie beyond an imaginary line IL extending from a side of the first bottom S/D region RX1 (or the second bottom S/D region RX2) in the second direction D2. The extension portion (or extension area) may lie beyond the imaginary line IL connecting a side of the first bottom S/D region RX1 to a side of the third bottom S/D region RX2 in the second direction D2.

Referring to FIG. 7B, a landing space for the gate contact structure CB to land on the gate connecting structure PB is enlarged due to the extended portion EP of the gate connecting structure PB. Thus, the via V0 can be securely connected to the gate contact structure CB, and thus a uniform metal pitch may be implemented.

Figure 8:
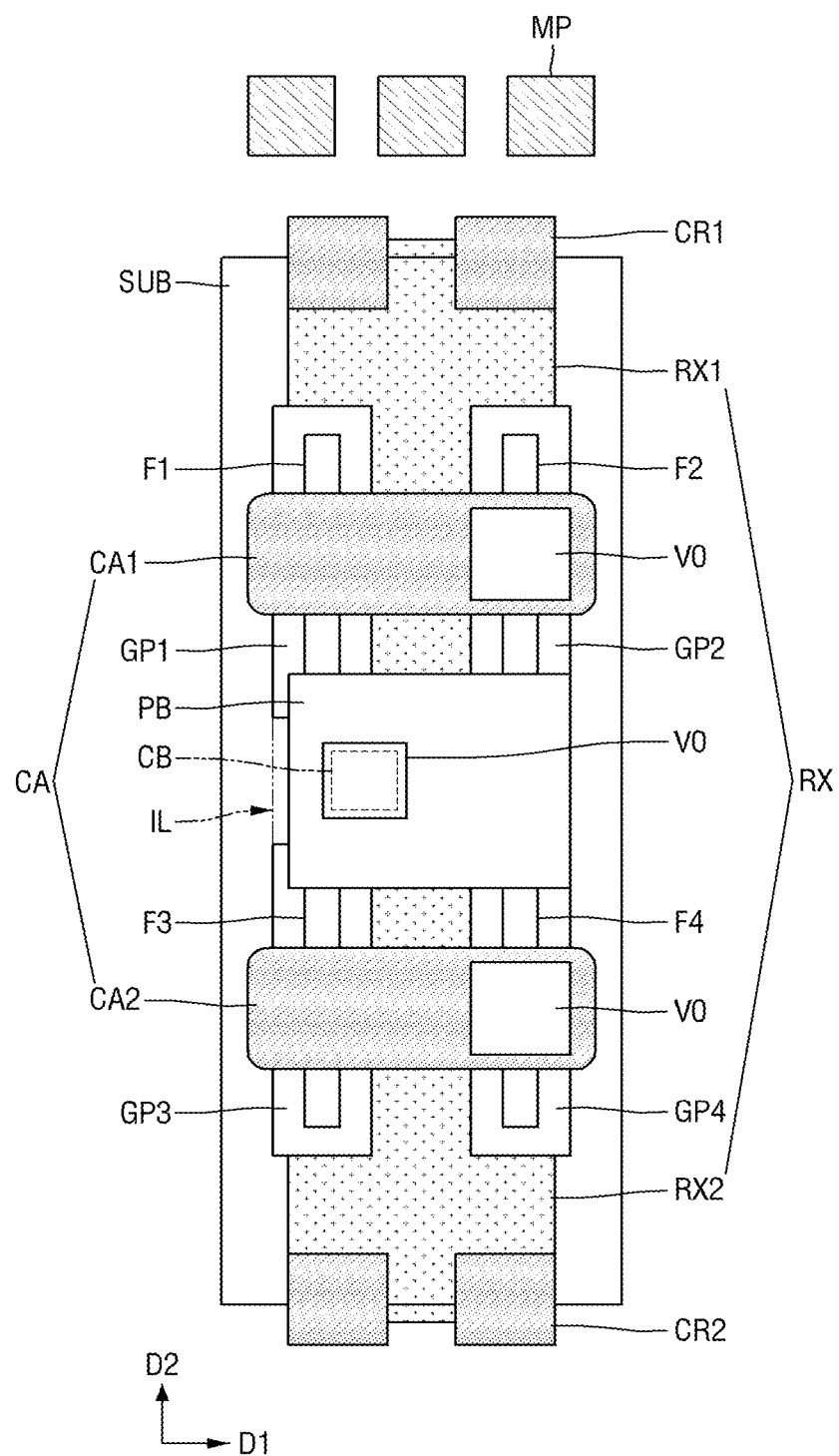
FIG. 8 is a second modified layout of the inverter X1 standard cell of FIG. 3, according to an example embodiment of the present inventive concepts.

FIG. 8 is a second modified layout of the inverter X1 standard cell of FIG. 3, according to an example embodiment of the present inventive concepts.

Referring to FIG. 8, in the case that a margin between the gate contact structure CB and a neighboring gate connecting structure PB is tight, to avoid an undesired bridge between the gate contact structure CB and a neighboring gate connecting structure PB (not shown), the gate connecting structure PB corresponding to the gate contact structure CB may be formed such that a side of the gate connection structure CB is recessed from (e.g., does not lie beyond) the imaginary line IL (which is a line connecting a side of the first bottom S/D region RX1 to a side of the third bottom S/D region RX2 in the second direction D2 in the first direction D1 when viewed in a plan view. For example, a first lateral side of the gate connecting structure PB may lie inwardly with respect to the imaginary line IL in the first direction D1 such that among two opposite sides of the gate connecting structure PB facing each other in the first direction, one side of the gate connecting structure PB may be laterally between two opposing sides of the first bottom S/D region RX1 (or two opposing sides of the second bottom S/D region RX2) in the first direction when viewed in a plan view.

FIG. 9A is a third modified layout of the inverter X1 standard cell of FIG. 3, according to an example embodiment of the present inventive concepts. FIG. 9B is a cross-sectional view of the modified layout of FIG. 9A taken along line IXB-IXB', according to an example embodiment of the present inventive concepts.

Referring to FIG. 9A, to secure a sufficient space for a via V0 to be connected to an underlying gate contact structure CB, the standard cell layout may be modified such that the gate contact structure CB is extended in the first direction D1. Thus, the gate contact structure CB as shown in FIG. 7A may be elongated in the first direction D1 toward a center of the gate connecting structure PB.

As shown in FIG. 9B, the modified layout illustrated in FIG. 9A provides an increased landing area for the via V0, and thus helps implement a more uniform metal pitch. Accordingly, a semiconductor device employing such layout may exhibit improved reliability.

Figure 10A:
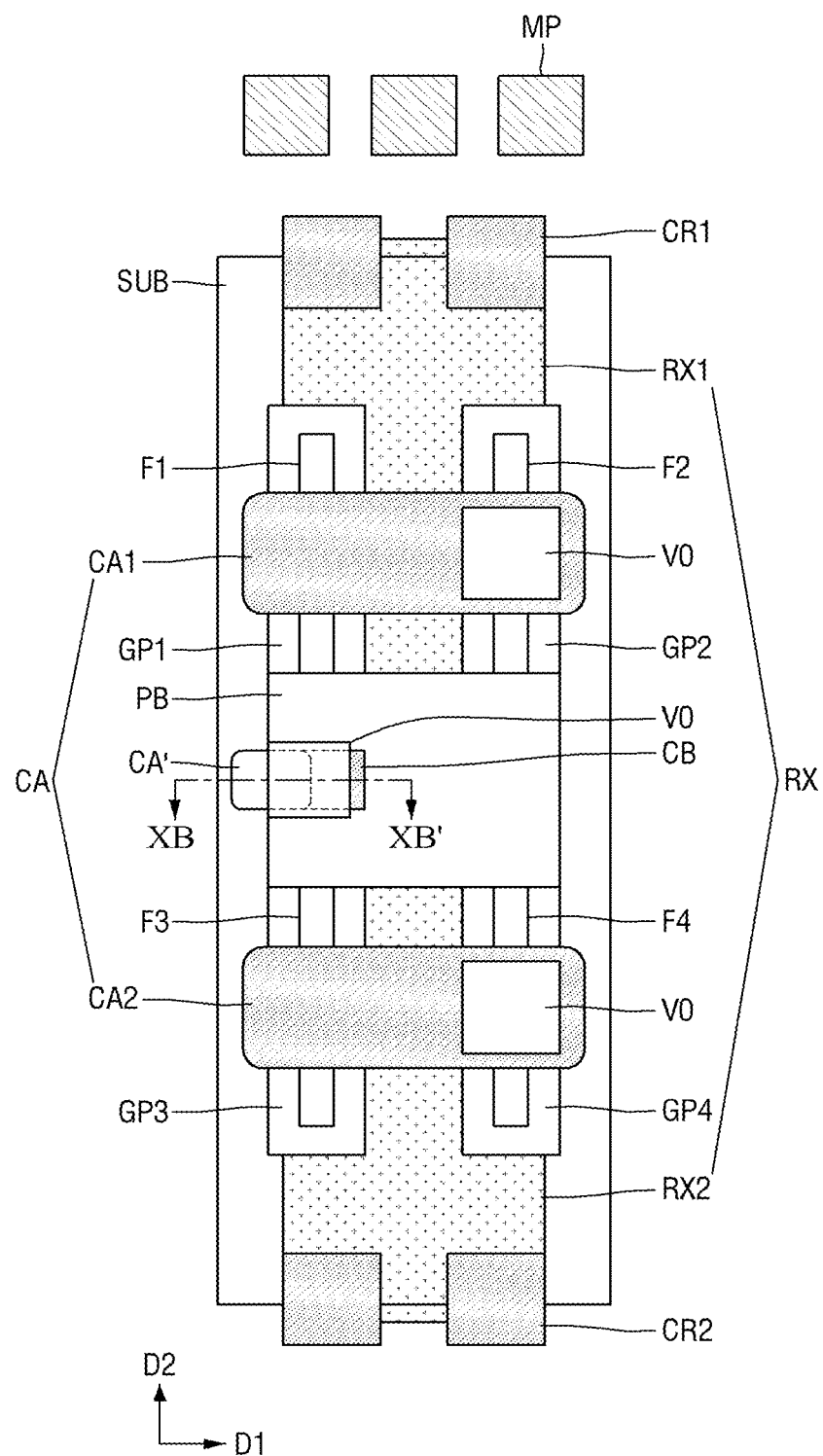
FIG. 10A is a fourth modified layout of the inverter X1 standard cell of FIG. 3, according to an example embodiment of the present inventive concepts.
Figure 10B:
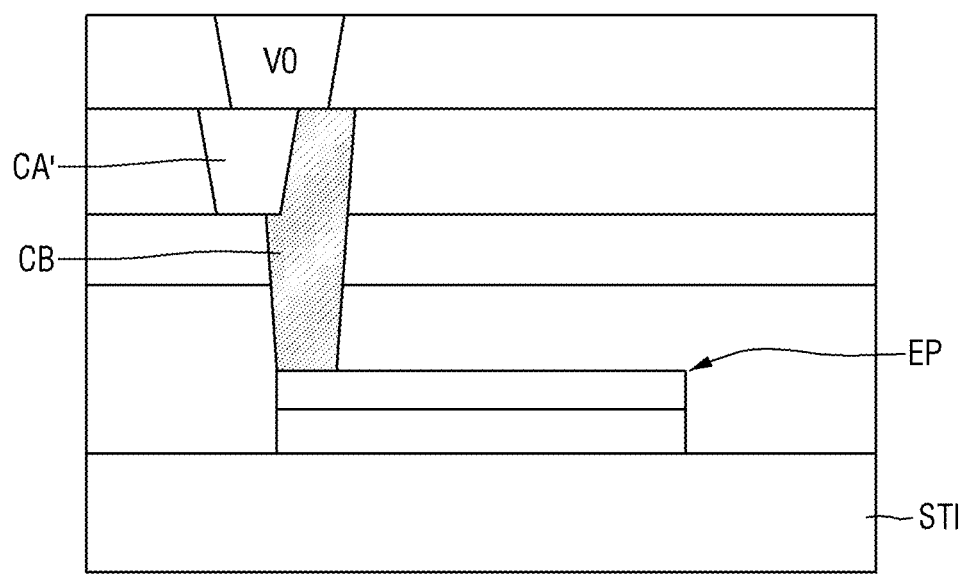
FIG. 10B is a cross-sectional view of the modified layout of FIG. 10A taken along line XB-XB', according to an example embodiment of the present inventive concepts.
Figure 10B:
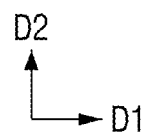

FIG. 10A is a fourth modified layout of the inverter X1 standard cell of FIG. 3, according to an example embodiment of the present inventive concepts. FIG. 10B is a cross-sectional view of the modified layout of FIG. 10A taken along line XB-XB', according to an example embodiment of the present inventive concepts.

Referring to FIG. 10A, to secure a sufficient space for a via V0 to be connected to an underlying gate contact structure CB, the standard cell layout may be modified such that an additional top S/D contact structure CA' is provided and merged with the gate contact structure CB illustrated in FIG. 9A. The additional top S/D contact structure CA' is formed simultaneously with the top S/D contact structures for the top S/D regions. The additional top S/D contact structure CA' may be formed to overlap the gate contact structure CB while not being connected to any of the top S/D regions.

As illustrated in FIG. 10B, the gate contact structure CB and the additional top S/D contact structure overlap each other and provides an expanded space (which is desired for implementing a uniform metal pitch) for the via V0 to land on the underlying gate contact structure CB. The modified layout illustrated in FIGS. 10A and 10B provides an increased landing area for the via V0, and thus helps implement a more uniform metal pitch. Accordingly, a semiconductor device employing such layout may exhibit improved reliability According to the modified layouts described above, a sufficient space for a via desired for implementing a uniform metal pitch can be provided. Thus, a standard cell having a gear ratio of m:n (where m and n are natural numbers, and n is greater than m) can be implemented It should be understood that example embodiments described herein should be considered in a descriptive sense only and not for purposes of limitation. While some example embodiments have been particularly shown and described, it will be understood by one of ordinary skill in the art that variations in form and detail may be made therein without departing from the spirit and scope of the claims.

What is claimed is:

1. Semiconductor device comprising:
 a vertical field effect transistor (VFET) including,
 a first fin, a second fin, a third fin, and a fourth fin protruding from a substrate,
 wherein the first fin and the second fin spaced apart from each other in a first direction and elongated in a second direction crossing the first direction, the third fin and the fourth fin spaced apart from each other in the first direction and elongated in the second direction,
 a gate including a first gate portion on a sidewall of the first fin, a second gate portion on a sidewall of the second fin, a third gate portion on a sidewall of the third fin, a fourth gate portion on a sidewall of the fourth fin, and a sixth gate portion connecting the first gate portion, the second gate portion, the third gate portion, and the fourth gate portion, a first top S/D including a first top S/D portion at a top of the first fin and a second top S/D portion at a top of the second fin, and a second top S/D including a third top S/D portion at a top of the third fin and a fourth top S/D portion at a top of the fourth fin;

a gate contact structure spaced apart from the first fin, the second fin, a third fin, and a fourth fin in the second direction when viewed in a plan view and connected to the sixth gate portion;

a top S/D contact structure connected to one of the first top S/D portion, the second top S/D portion, the third top S/D portion or the fourth top S/D portion, at least one of the top S/D contact structure or the gate contact structure serving as a first conductive routing layer in the first direction; and metal patterns on the gate contact structure and the top S/D contact structure, the metal patterns configured to be connected to at least one of the gate contact structure or the top S/D contact structure through vias, respectively, the metal patterns serving as a second conductive routing layer in the second direction.

2. The semiconductor device of claim 1, wherein the first gate portion and the second gate portion are spaced apart by a first pitch in the first direction, the third gate portion and the fourth gate portion are spaced apart by the first pitch in the first direction, and the metal patterns are arranged by a second pitch different from the first pitch in the first direction.

3. The semiconductor device of claim 2, wherein a ratio between the first pitch and the second pitch is m:n, where m and n are natural numbers, and n is greater than m.

4. The semiconductor device of claim 3, wherein the m is 2 and the n is 3.

5. The semiconductor device of claim 3, wherein the m is 3 and the n is 4.

6. The semiconductor device of claim 3, wherein the m is 1 and the n is 2.

7. The semiconductor device of claim 1, wherein when viewed in a plan view, at least one side of the sixth gate portion includes an extension area in the first direction that lies beyond an imaginary line, which is connecting a side of the first gate portion and a side of the third gate portion and extending in the second direction.

8. The semiconductor device of claim 1, wherein when viewed in a plan view, a side of the sixth gate portion is within an imaginary line in the first direction, which is connecting a side of the first gate portion and a side of the third gate portion and extending in the second direction.

9. The semiconductor device of claim 1, further comprising:

a first bottom S/D of the VFET enclosing at least a portion of the first fin, the second fin, the first gate portion, and the second gate portion, when viewed in a plan view; and a second bottom S/D of the VFET enclosing at least a portion of the third fin, the fourth fin, the third gate portion, and the fourth gate portion, when viewed in a plan view, wherein the first bottom S/D and the second bottom S/D are grown by epitaxial on the substrate.

10. The semiconductor device of claim 9, further comprising:

a first bottom S/D contact structure; and a second bottom S/D contact structure, which is spaced apart from each other in the second direction, wherein each of the first bottom S/D contact structure and the second bottom S/D contact structure are overlapping at least of a portion of the first bottom S/D and the second bottom S/D.

11. The semiconductor device of claim 9, when viewed in a plan view, the gate contact structure is elongated away from an imaginary line, which is connecting a side of the first gate portion and a side of the third gate portion and extending in the second direction.

12. The semiconductor device of claim 1, wherein a first fin, a second fin, a third fin, and a fourth fin are grown by epitaxial on the substrate.

13. The semiconductor device of claim 1, further comprising:

an additional top S/D contact structure overlapping the gate contact structure and not connected to the sixth gate portion.

14. An inverter comprising:

a multi-gate vertical field effect transistor (multi-gate VFET) including, a first fin and a second fin protruding from a substrate, the first fin and the second fin spaced apart from each other in a second direction and elongated in a second direction crossing the first direction, a first bottom S/D and a second bottom S/D of the multi-gate VFET on the substrate, each of the first bottom S/D and the second bottom S/D surrounding each of the first fin and the second fin, a first top S/D including a first top S/D portion at a top of the first fin and a second top S/D portion at a top of the second fin, and a gate including a first gate portion on a sidewall of the first fin, a second gate portion on a sidewall of the second fin, and a third gate portion connecting the first gate portion with the second gate portion, the third gate portion overlapping an end region of the first bottom S/D and the second bottom S/D;

a gate contact structure spaced apart from the first fin, and the second fin in the second direction when viewed in a plan view and connected to the third gate portion;

a first top S/D contact structure connected to the first top S/D portion, and a second top S/D contact structure connected to the second top S/D portion, at least one of the gate contact structure, the first top S/D contact structure, or the second top S/D contact structure serving as a first conductive routing layer in the first direction; and metal patterns on the gate contact structure, the first top S/D contact structure and the second top S/D contact structure, the metal patterns configured to be connected to at least one of the gate contact structure, the first top S/D contact structure or the second top S/D contact structure, through vias, the metal patterns serving as a second conductive routing layer in the second direction.

15. The inverter of claim 14, wherein when viewed in a plan view, at least one side of the third gate portion includes an extension area in the first direction that lies beyond an imaginary line, which is connecting a side of the first gate portion and a side of the second gate portion and extending in the second direction.

16. The inverter of claim 14, wherein when viewed in a plan view, a side of the third gate portion is within an imaginary line in the first direction, which is connecting a side of the first gate portion and a side of the second gate portion and extending in the second direction.

17. The inverter of claim 14, further comprising:
a first bottom S/D contact structure; and
a second bottom S/D contact structure, which is spaced apart from each other in the second direction,
wherein each of the first bottom S/D contact structure and the second bottom S/D contact structure are overlapping at least of a portion of the first bottom S/D and the second bottom S/D.

18. The inverter of claim 14, when viewed in a plan view, the gate contact structure is elongated away from an imaginary line, which is connecting a side of the first gate portion and a side of the second gate portion and extending in the second direction.

19. The inverter of claim 14, further comprising:
an additional top S/D contact structure overlapping the gate contact structure and not connected to the third gate portion.

\* \* \* \* \*